(12) United States Patent  
Shiga

(10) Patent No.: US 6,963,501 B2  
(45) Date of Patent: Nov. 8, 2005

(54) NONVOLATILE MEMORY

(75) Inventor: Hitoshi Shiga, Matsuyama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/799,776

(22) Filed: Mar. 15, 2004

(65) Prior Publication Data

US 2005/0078519 A1   Apr. 14, 2005

(30) Foreign Application Priority Data

Oct. 10, 2003  (JP) .............................. 2003-352604

(51) Int. Cl.$^7$ ........................................... G11C 16/04
(52) U.S. Cl. ........................... 365/185.03; 365/185.04; 365/185.33
(58) Field of Search ...................... 365/185.03, 185.04, 365/185.33

(56) References Cited

U.S. PATENT DOCUMENTS

| | | | |
|---|---|---|---|
| 6,198,657 B1 * | 3/2001 | Uekubo et al. ........ | 365/185.04 |
| 6,240,019 B1 | 5/2001 | Shiga et al. | |
| 6,381,175 B2 * | 4/2002 | Pitts ...................... | 365/185.33 |
| 6,434,080 B1 | 8/2002 | Shiga | |
| 6,700,820 B2 * | 3/2004 | Elmhurst et al. ...... | 365/185.03 |
| 6,807,095 B2 * | 10/2004 | Chen et al. ............ | 365/185.03 |

FOREIGN PATENT DOCUMENTS

| | | |
|---|---|---|
| JP | 8-45275 | 2/1996 |
| JP | 2000-243095 | 9/2000 |
| JP | 2001-135086 | 5/2001 |

* cited by examiner

Primary Examiner—Trong Phan  
(74) Attorney, Agent, or Firm—Oblon, Spivak, McClelland, Maier & Neustadt, P.C.

(57) ABSTRACT

An aspect of the present invention provides a nonvolatile memory that includes a memory cell array including a data storage area to store a data, and a data invert flag storage area to store a data invert flag indicating whether or not the data is inverted. The memory cell array outputs selected data and a data invert flag related to the selected data. A state machine determines whether or not the number of memory cells to which a bias voltage is applied is equal to or greater than a predetermined number when writing data into the memory cell array. The state machine instructs a data controller to transfer inverted data and a data invert flag if it is equal to or greater than the predetermined number.

20 Claims, 5 Drawing Sheets

| INPUT DATA | TRANSFORMED DATA | FLAG |
|---|---|---|
| 0000 | 1111 | 0 |
| 0001 | 1110 | 0 |
| 0010 | 1101 | 0 |
| 0011 | 0011 | 1 |
| 0100 | 1011 | 0 |
| 0101 | 0101 | 1 |
| 0110 | 0110 | 1 |
| 0111 | 0111 | 1 |
| 1000 | 0111 | 0 |
| 1001 | 1001 | 1 |
| 1010 | 1010 | 1 |
| 1011 | 1011 | 1 |
| 1100 | 1100 | 1 |
| 1101 | 1101 | 1 |
| 1110 | 1110 | 1 |
| 1111 | 1111 | 1 |

NONVOLATILE MEMORY

CROSS REFERENCE TO RELATED APPLICATIONS

This application is based upon and claims the benefit of priority from the prior Japanese Patent Application No. P2003-352604 filed on Oct. 10, 2003, the entire contents of which are incorporated herein by reference.

BACKGROUND OF THE INVENTION

1. Field of the Invention

The present invention relates to a nonvolatile memory, and particularly, to a technique of improving the writing speed of a nonvolatile memory.

2. Description of Related Art

Nonvolatile memories such as flash memories are generally provided with an automatic write function that controls, in response to a write command involving a write address and data, an internal power source, decoders, and a sense amplifier in a chip, to automatically conduct writing and write verification.

FIG. 8 is a flowchart showing a write process of a nonvolatile memory according to a related art. A write command is input to start an internal sequence. First, it is determined whether or not a write target address is in a write-protect state (step S101). If the target address is write-protected, the process ends. If the target address is writable, a write setup is conducted (step S102). Thereafter, a write operation is carried out (step S103). In the write operation, a target cell is selected through decoders, and a write voltage is applied to the target cell to write data therein. Then, a verify setup is carried out (step S104). The verify setup switches an internal voltage from a write level to a verify read level. A verify read operation is conducted to see if information written in the target cell agrees with the write data that should be written in the target cell (step S105). If the verification succeeds, the process ends. If the verification fails, the write data is set (step S106), and the flow returns to step S102 to again write the data. These steps form an automatic write sequence.

FIG. 9 is a view explaining bias conditions of a memory cell 10 in which hot electrons are written. Between a drain 12 and a source 14 of the memory cell, a voltage of about 5 V is applied, and a voltage of 10 V is applied to a gate 16 of the memory cell. This results in passing a large current 18 through a channel and drawing hot electrons 20 to a floating gate by an electric field between the gate and the channel, thereby achieving a write operation. If the memory cell is designed to represent "1" with an erased state, writing "0" in the memory cell is achieved by applying 5 V to the drain thereof and writing "1" in the memory cell is achieved by opening the drain thereof.

A related art disclosed in Japanese Patent Laid Open Publication (Kokai) No. 2001-135086 (FIG. 1) aims to shorten a memory write time and reduce power consumption. This related art carries out a write operation for a plurality of addresses that are randomly input, without turning on and off a step-up power source, to thereby reduce power consumption.

A related art disclosed in Japanese Patent Laid Open Publication (Kokai) No. 2000-243095 (FIG. 1) sequentially selects a plurality of memory cells in a memory and writes data therein. To shorten a write time any temperature conditions, the related art divides the memory cells into first and second groups and sets a first write condition of voltage and voltage applying time. Under this condition, the related art sequentially selects, writes, and verifies the memory cells of the first group. According to a time spent for writing all memory cells of the first group, the voltage and voltage applying time are changed to a second write condition. Under the second write condition, the memory cells of the second group are sequentially selected, written, and verified.

These related arts, however, pass a large current to conduct a write operation, and therefore, have a limitation in the number of cells that are collectively selected and written. One reason of this limitation is the current supply capacity of an internal electric potential controller that generates a step-up electric potential for the write current. Another reason is a potential float occurring at the source of a memory cell due to the large current passing therethrough. As the capacity of a memory chip increases, the problem of an increase in a total write time for the chip becomes more serious.

SUMMARY OF THE INVENTION

An aspect of the present invention provides a nonvolatile memory that includes a memory cell array including, a data storage area configured to store a data, and a data invert flag storage area configured to store a data invert flag indicating whether or not the data is inverted, the memory cell array configured to output selected data and a data invert flag related to the selected data, a state machine configured to determine whether or not the number of memory cells to which a bias voltage is applied is equal to or greater than a predetermined number when writing data into the memory cell array, the state machine configured to instruct a data controller to transfer inverted data and a data invert flag if it is equal to or greater than the predetermined number, and the data controller configured to receive the data to be written into the memory cell array, the data controller configured to transfer, to the memory cell array, the data inverted according to the instruction of the state machine and the data invert flag.

Another aspect of the present invention provides a nonvolatile memory that includes a memory cell array having a plurality of arrayed memory cells including, data storage cells configured to store data, and a data invert flag storage cell configured to store a data invert flag indicating whether or not the data is inverted, the memory cell array configured to output selected data and a data invert flag related to the selected data, a row decoder configured to select a word line of the memory cell array related to the data, a column decoder configured to select bit lines of the memory cell array related to the data, a data controller configured to receive the data to be stored in the memory cell array, the data controller configured to transfer the data, or inverted data and the data invert flag related to the data to the memory cell array, the data controller configured to provide a write bit line voltage through the column decoder to corresponding memory cells in the memory cell array when transferring, a state machine configured to determine whether or not the number of memory cells to which a bias voltage is applied is equal to or greater than a predetermined number, when writing the data into the memory cell array, the state machine configured to instruct a data controller to transfer inverted data and the data invert flag if it is equal to or greater than the predetermined number, and a sense amplifier connected to bit lines of the memory cell array through the column decoder, the sense amplifier configured to invert, in a data read operation, selected data according to a data invert flag related to the selected data and output the inverted data.

A further aspect of the present invention provides a nonvolatile memory that includes a memory cell array having a plurality of arrayed memory cells including, data storage cells configured to store data, and a data invert flag storage cell configured to store a data invert flag indicating whether or not the data is inverted, the data storage cells and the data invert flag storage cell corresponding to the data storage cells is in the same row, the memory cell array configured to output selected data and a data invert flag related to the selected data, a row decoder configured to select a word line of the memory cell array related to the data, a column decoder configured to select a bit line of the memory cell array related to the data, an internal power controller configured to control a voltage applied to the memory cell array, a protect register configured to store write-protect information concerning a given storage place in the memory cell array, a command interface configured to receive a command related to an operation of the nonvolatile memory, a state machine configured to receive, in response to an operation instruction from the command interface, write-protect information from the protect register, the state machine configured to determine a state of a data storage cell in the memory cell array related to a write target address, the state machine configured to obtain write data from a data controller if it is determined that the data storage place is writable, the state machine configured to determine whether or not the number of memory cells to which a bias voltage is applied is equal to or greater than a predetermined number when writing the data in the memory cell array, the state machine configured to instruct a data controller to transfer inverted data and a data invert flag if it is greater than the predetermined number, the data controller configured to receive the data to be stored in the memory cell array, the data controller configured to transfer data inverted according to the instruction from the state machine and the data invert flag related to the inverted data to the memory cell array, the data controller configured to supply a write bit line voltage from the internal power controller through the column decoder to the target memory cells in the memory cell array, and a sense amplifier connected to bit lines of the memory cell array through the column decoder, the sense amplifier configured to invert, in a data read operation, selected data according to a data invert flag related to the selected data and output the inverted data.

DETAILED DESCRIPTION OF EMBODIMENTS

Figure 1:
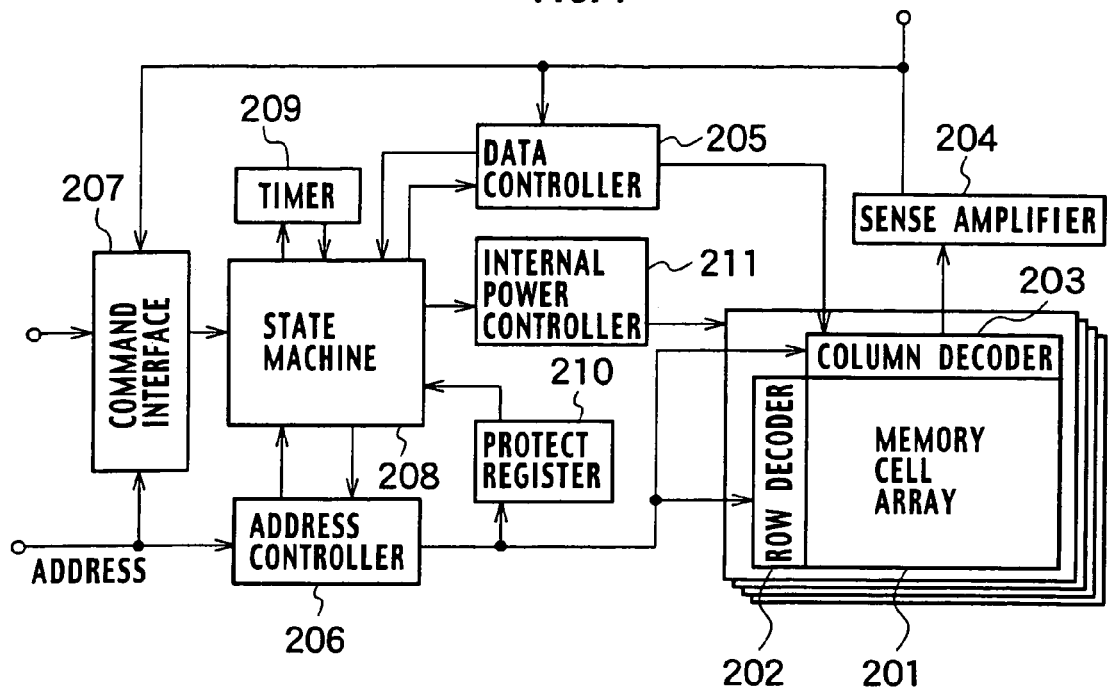
FIG. 1 is a block diagram showing a nonvolatile memory according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a block diagram showing a nonvolatile memory according to a first embodiment of the present invention. The nonvolatile memory has a memory cell array 201 in which nonvolatile memory cells are arranged in an array. The memory cell array 201 has a data storage area to store data and a data invert flag storage area to store a data invert flag indicating whether or not the data is inverted. A data storage place to store data and a data invert flag storage place to store a data invert flag related to the data are secured in the same row in the memory cell array 201. The memory cell array 201 outputs selected data and a data invert flag related to the selected data. The nonvolatile memory also has a row decoder 202 to select a word line of the memory cell array 201 for data to store, a column decoder 203 to select a bit line of the memory cell array 201 for the data to store, an internal power controller 211 to control a voltage applied to the memory cell array 201, a protect register 210 to store write protect information concerning a given storage area in the memory cell array 201, a command interface 207 to receive a command related to a memory operation, and a state machine 208. The state machine 208 receives an operation instruction from the command interface 207, receives write protect information from the protect register 210 in response to the operation instruction, determines a state of a storage place at a write target address, and if it is determined that the storage place is writable, obtains write data from a data controller 205. To write the write data in the memory cell array 201, the state machine 208 determines whether or not the number of memory cells in the memory cell array 201 to which a bias voltage is applied is equal to or greater than a predetermined number. If it is greater than the predetermined number, the state machine 208 instructs the data controller 205 to transfer, to the memory cell array 201, inverted data and a data invert flag indicating that the data is inverted. The data controller 205 receives the data to be stored in the memory cell array 201, transfers the data inverted according to the instruction of the state machine 208 and the data invert flag to the memory cell array 201. To achieve the transfer, a write bit line voltage is applied from the internal power controller 211 through the column decoder 203 to target memory cells. The nonvolatile memory further has a sense amplifier 204 connected to the bit lines of the memory cell array 201 through the column decoder 203. When reading selected data, the sense amplifier 204 inverts the data according to a data invert flag related to the data.

The state machine 208 may be configured in another way. Namely, in response to an operation instruction from the command interface 207, the state machine 208 receives write protect information stored in the protect register 210, determines states of a plurality of storage places at write target addresses, and if it is determined that all of these storage places are writable, obtains a plurality of write data pieces from the data controller 205. To write the plurality of write data pieces in the memory cell array 201, the state machine 208 determines whether or not the number of memory cells in the memory cell array 201 to which a bias voltage is applied is equal to or greater than a predetermined number. If it is determined that the number of memory cells to which a bias voltage is applied is equal to or greater than the predetermined number, the state machine 208 instructs the data controller 205 to transfer, to the memory cell array 201, inverted ones of the plurality of write data pieces and a data invert flag indicating that the data pieces are inverted.

The state machine 208 may determine whether or not the number of memory cells in the memory cell array 201 to which a bias voltage is applied is equal to or greater than a half of the number of bits of write data. If it is equal to or greater than a half of the number of bits of the write data, the state machine 208 instructs the data controller 205 to transfer, to the memory cell array 201, inverted data of the write data and a data invert flag indicating that the data is inverted.

When determining whether or not the number of memory cells in the memory cell array 201 to which a bias voltage is applied is equal to or greater than a predetermined number, the state machine 208 may refer to a write current supply capacity of the internal power controller 211. According to the determination, the state machine 208 instructs the data controller 205 to transfer, to the memory cell array 201, inverted data and a data invert flag indicating that the data is inverted.

The command interface 207 determines a chip operation such as a read operation or a write/erase operation. When detecting an automatic operation mode at the command interface 207, the state machine 208 controls a sequence of operations of the address controller 206, power controller 211, and data controller 205. A timer 209 counts predetermined time such as bias application time for the memory cell array 201 and transition time for internal power. The protect register 210 stores write protect information and the like and provides write restrictions.

NOR flash memory cells arranged in an array may be employed as the memory cell array 201 according to the embodiment. The row decoder 202 decodes a row address specified by the address controller 206 and data controller 205 (to be explained later) and selects a row in the memory cell array 201. The column decoder 203 decodes a column address specified by the address controller 206 and data controller 205 and selects a column in the memory cell array 201. The column decoder 203 includes column switching transistors.

The sense amplifier 204 reads data stored in a selected memory cell of the memory cell array 201. Namely, the sense amplifier 204 receives an electric potential read from the selected memory cell, compares the electric potential with a reference voltage, determines data, and outputs the determined data to the data controller 205 and command interface 207.

Detecting an automatic operation mode at the command interface 207, the state machine 208 controls a sequence of operations of the address controller 206, internal power controller 211, and data controller 205. According to the embodiment, the state machine 208 writes data in the memory cell array 201 by controlling the address controller 206, internal power controller 211, and data controller 205.

Figure 2:
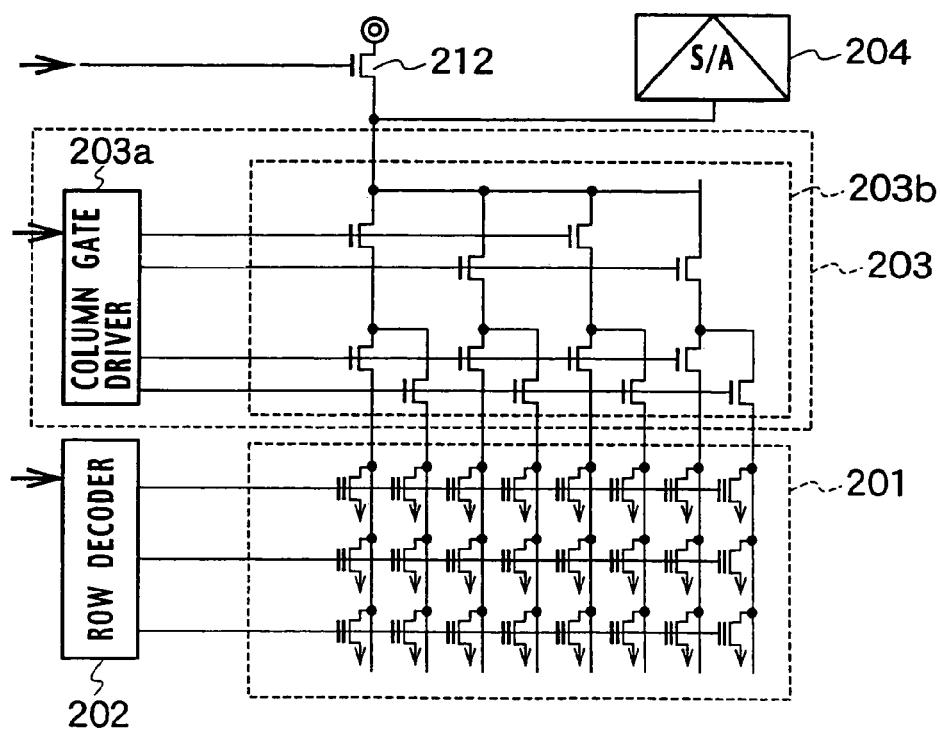
FIG. 2 is a view showing the details of the memory cell array 201, row decoder 202, column decoder 203, sense amplifier 204, and a part of the data controller 205.

FIG. 2 is a view showing the details of the memory cell array 201, row decoder 202, column decoder 203, sense amplifier 204, and a part of the data controller 205. In FIG. 2, the column decoder 203 includes a column gate driver 203a and a column gate 203b. The column decoder 203 is connected to a plurality of column bit lines of the memory cell array 201. The row decoder 202 is connected to a plurality of rows in the memory cell array 201. A target cell in the memory cell array 201 is selectable with the row decoder 201, column gate 203b, and column gate driver 203a. A write bias is transferred through a write voltage transfer transistor 212 according to write data. When writing "0" in a memory cell, the transistor 212 is turned on to transfer a write voltage Vpp to the cell. When writing "1" in a memory cell, the transistor 212 is turned off. At this time, the drain (column bit line) of the selected memory cell becomes a floating state. To carry out a read operation or a verify read operation, a selected column bit line is connected to the sense amplifier 204, and the transistor 212 is turned off.

Figures 3, 4:
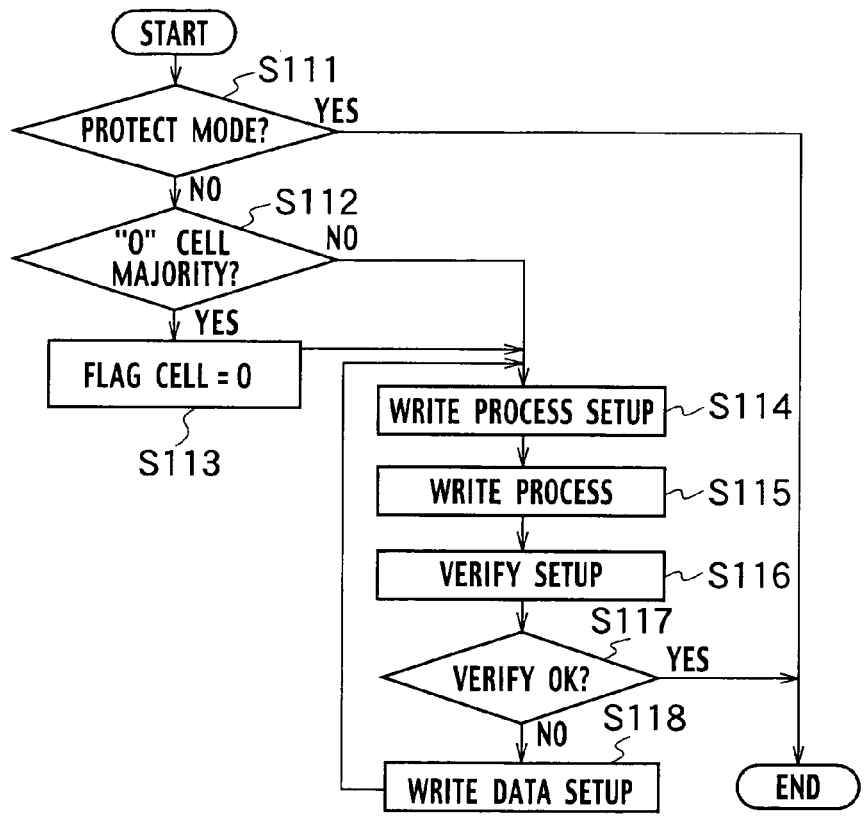
FIG. 3 is a flowchart showing an automatic write process for the nonvolatile memory according to the first embodiment.
FIG. 4 shows a data conversion table for an input/output width of 4.

FIG. 3 is a flowchart showing an automatic write process for the nonvolatile memory according to the first embodiment. The sequence of the flowchart starts when the state machine 208 initiates an internal operation sequence in response to a write command. First, protect information stored in the protect register 210 is obtained to see if a write protect state is enabled (step S111). If a target address where data is to be written is write-protected, the automatic write process ends. If the target address is writable, the state machine 208 obtains write data from the data controller 205 and determines whether or not the number of memory cells to which "0" are written is equal to or greater than a predetermined number (step S112).

If it is determined that the number of memory cells to which a write bias is applied (the number of "0" bits in the write data) is equal to or greater than the predetermined number, for example, if the number is above a half of the number of bits of the write data, the write data is inverted and is written in the memory cell array 201 (step S113). According to the embodiment, there is provided the data invert flag storage area (not shown). If the data is inverted as mentioned above, information indicating that the data is inverted is stored in the data invert flag storage area. For example, a data invert flag is stored in a data invert flag cell in the data invert flag storage area of the memory cell array 201. The data invert flag is related to given data, and when the given data is inverted, the flag is set to "0" and is stored in the corresponding data invert flag cell. Instead, the data invert flag may be set to "0" when corresponding data is not inverted. The predetermined number used to determine whether or not write data are inverted may be determined according to a write current supply capacity of the internal power controller 211. After the data inversion, a write setup is carried out (step S114). The write setup generates an internal voltage to apply a write voltage to a target cell. More precisely, a required voltage is generated by a step-up circuit (not shown) such as a charge pump. Thereafter, a write operation is carried out (step S115). According to the embodiment, the write operation writes, in the memory cell array 201, write data (or inverted write data) and a data invert flag. In the write operation, a target cell is selected through the decoders 202 and 203, and a write voltage is applied to the selected target cell. Then, a verify setup is conducted (step S116). The verify setup changes the internal voltage from the write level to a verify read level. A verify read operation is conducted to see if the information written in the target cell agrees with the write data (step S117). If the verification is successful, the process ends. If the verification fails, the data to be written is set (step S118), and the flow returns to step S114 to repeat the write operation.

FIG. 4 shows a data conversion table for an input/output width of 4. From the left-hand side to the right-hand side, the table shows write data input to the data controller 205, inverted write data, and data invert flags. In the table, a data invert flag of "0" indicates that input data is inverted and stored in the memory cell array 201. A data invert flag of "1" indicates that input data is stored as it is in the memory cell array 201. According to the embodiment, the input/output width of data to be written is four bits. If the number of "0" bits (write bits) is 0, 1, or 2 among the four bits of given data, the data is not inverted. Namely, the data is stored as it is in the memory cell array 201, and the data invert flag related to the data is set to "1." If the number of "0" bits is 3 or 4 in given data, the data is inverted and a data invert flag bit corresponding to the data is set to "0." After the conversion according to the embodiment, every data piece has two or smaller number of "0" bits that need a write bias voltage. Here, suppose that the maximum number of bits (write bits) that are simultaneously written is two due to the restriction of the write current supply capacity of the internal power controller 211. With this restriction of two simultaneous write bits at the maximum, each data piece of four bits involve two write operations at the maximum if no data conversion is conducted. With the data conversion according to the embodiment, every data piece of four bits is completely written with one application of a bias voltage (write voltage).

Figure 5:
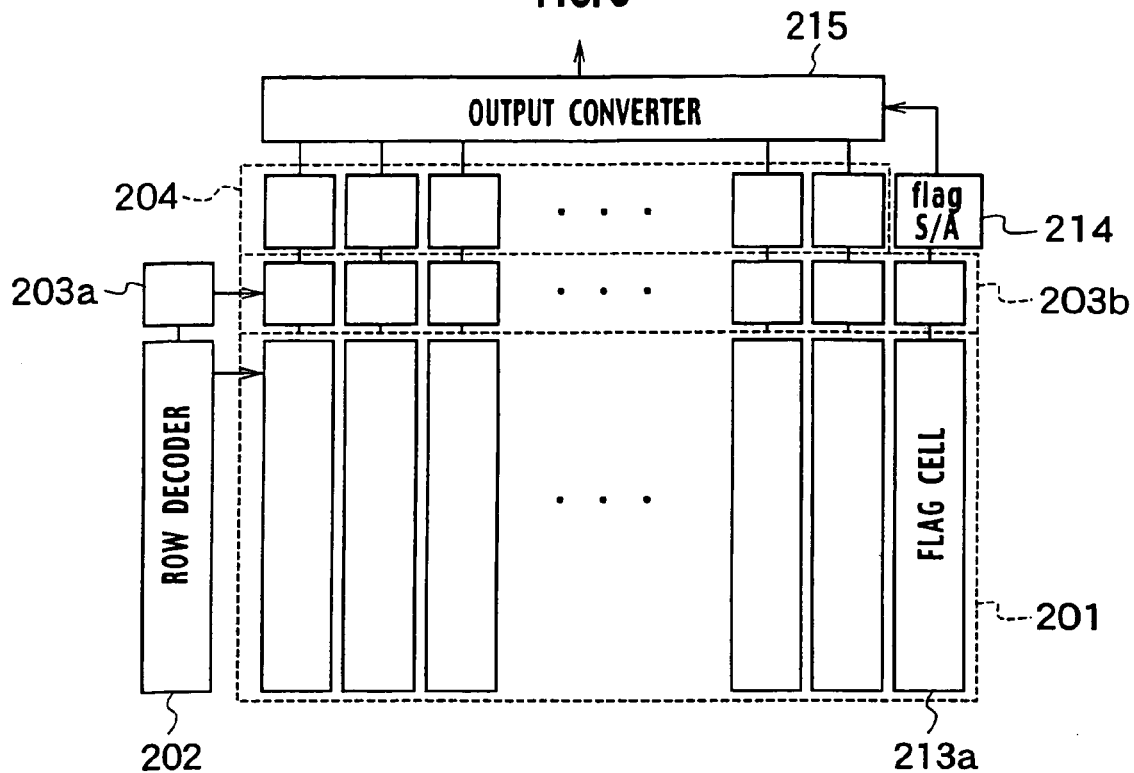
FIG. 5 is a view partly showing the details of the memory cell array 201, row decoder 202, column decoder 203, and sense amplifier 204 according to the first embodiment.

FIG. 5 is a view partly showing the details of the memory cell array 201, row decoder 202, column decoder 203, and sense amplifier 204 according to the first embodiment. With reference to FIG. 5, a read operation of the nonvolatile memory according to the embodiment will be explained. The embodiment prepares data invert flag cells 213a in the memory cell array 201. When data is specified with the row decoder 202 and is read, a flag in a data invert flag cell 213a corresponding to the read data is also read. Namely, given data stored in the memory cell array 201 is selected through the row decoder 202 and column decoder (203a, 203b), and the selected data is read and supplied to the sense amplifier 204. At the same time, a flag in a data invert flag cell 213a related to the selected data is also read through a column gate and is amplified by an invert flag sense amplifier 214. Then, the data read from the memory cell array 201 and the corresponding data invert flag are supplied to an output converter 215. The output converter 215 converts the data according to the data invert flag and outputs the converted data.

The memory cell array 201 according to the first embodiment prepares a data invert flag for every data piece corresponding to an individual address. Namely, one data invert flag is allocated for each input/output bit width. For example, if a bit width is 16, one data invert flag bit is added thereto to make a total bit width of 17 bits. The nonvolatile memory according to the embodiment may be a NOR-type nonvolatile memory or a NOR-type flash memory.

Memory cells in the memory cell array 201 except the data invert flag cells 213a are data cells to store data. These data cells are arranged on a plurality of column bit lines, and the flag cells are arranged on column bit lines that are different from those for the data cells. According to the embodiment, one flag cell is provided for each address of the data cells.

As explained above, the nonvolatile memory according to the first embodiment reduces the number of write operations conducted on a memory cell array, to shorten a write time and reduce power consumption.

Second Embodiment

A nonvolatile memory according to a second embodiment of the present invention will be explained in detail with reference to the drawings.

Figure 6:
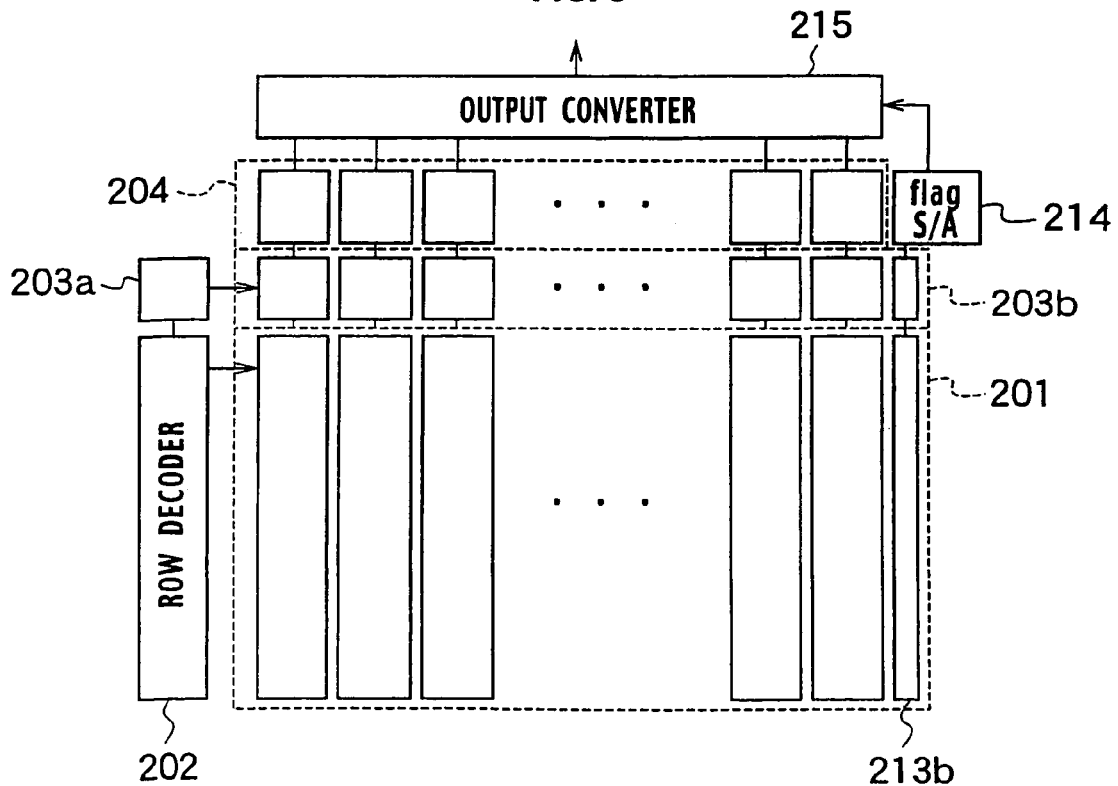
FIG. 6 shows the nonvolatile memory according to the second embodiment, and in particular, the details of a memory cell array 201, a row decoder 202, a column decoder 203, and a sense amplifier 204 of the nonvolatile memory.

FIG. 6 shows the nonvolatile memory according to the second embodiment, and in particular, the details of a memory cell array 201, a row decoder 202, a column decoder 203, and a sense amplifier 204 of the nonvolatile memory. The other parts of the second embodiment are the same as those of the first embodiment of FIG. 1.

According to the second embodiment, a write command involves not a single address of data but a series of addresses of data, for example, a series of eight addresses of data. Among such data of plural addresses, the second embodiment determines whether or not the number of "0" bits is equal to or larger than a predetermined number which may be a half of the total number of bits of the data. Namely, according to the second embodiment, a plurality of data pieces represented with a plurality of addresses share a data invert flag. Sharing a data invert flag bit with a plurality of data pieces can reduce the number of columns of data invert flag cells 213b. Compared with assigning a data invert flag for every address like the first embodiment, assigning a data invert flag for every eight addresses can reduce the number of data-inverting-flag columns to ⅛.

In this case, a sense amplifier covering eight addresses may be provided to simultaneously conduct verify read operations for eight addresses. Instead, a sense amplifier covering a single address may be provided to conduct a verify read operation address by address, to reduce the number of sense amplifiers.

Figure 7:
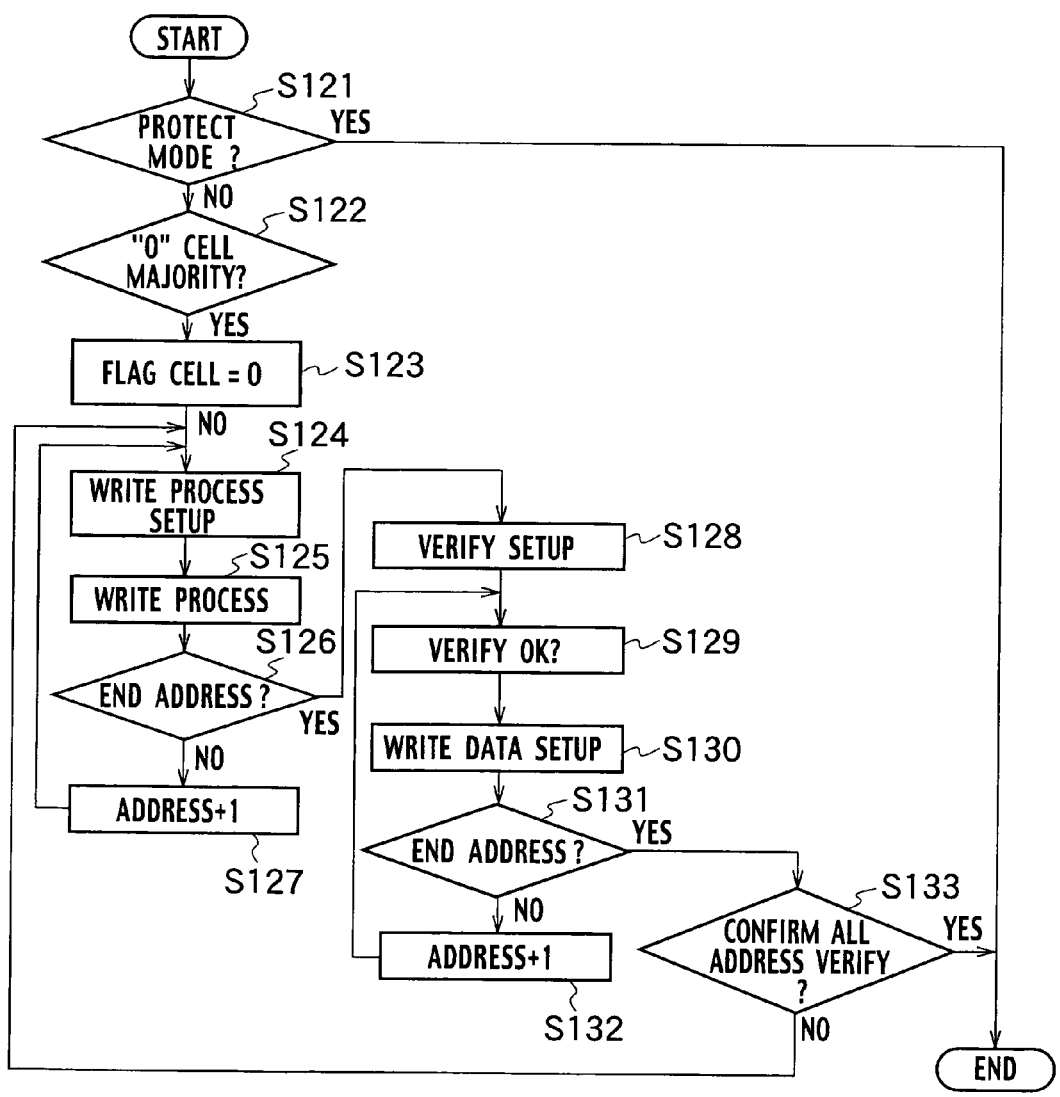
FIG. 7 is a flowchart showing an automatic write sequence conducted on the nonvolatile memory according to the second embodiment.
Figure 8:
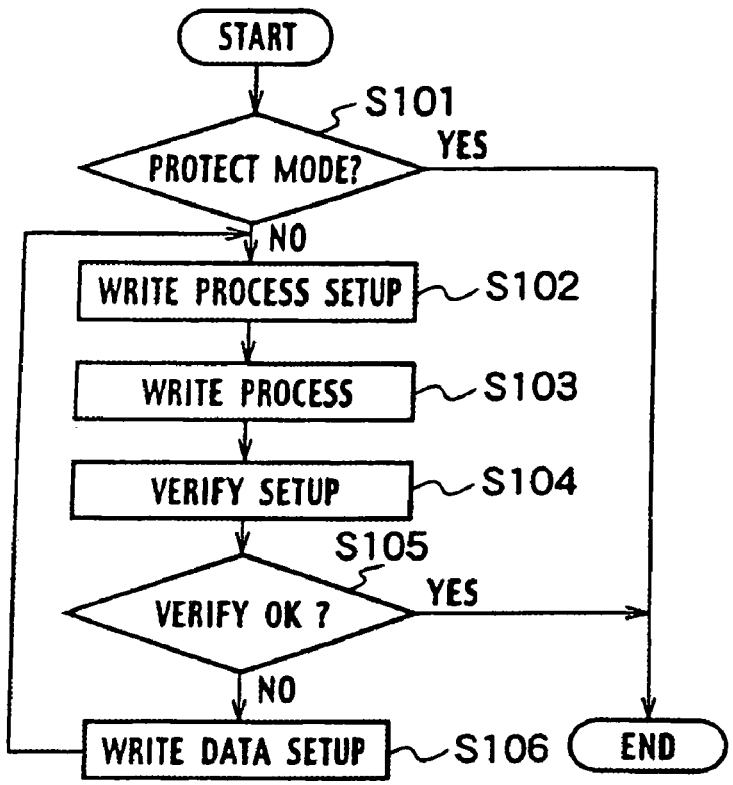
FIG. 8 is a flowchart showing a write process of a nonvolatile memory according to a related art.
Figure 9:
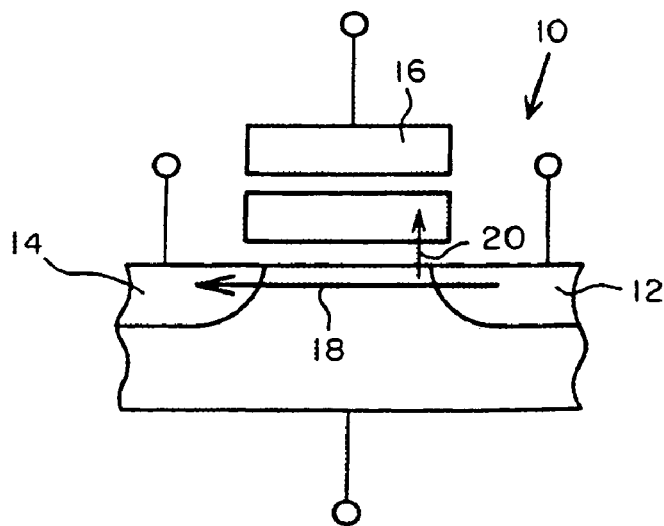
FIG. 9 is a view explaining bias conditions of a memory cell in which hot electrons are written.

FIG. 7 is a flowchart showing an automatic write sequence conducted on the nonvolatile memory according to the second embodiment. Like the first embodiment, steps of the flowchart of FIG. 7 start in response to a write command. Upon receiving the write command, the state machine 208 (FIG. 1) starts an internal sequence. According to the second embodiment, the write command provides a start address and write data for a plurality of addresses starting from the start address. The state machine 208 receives, with the write command, the start address to write data and the number of data pieces to write or a last address. According to the information, the state machine 208 executes the steps of FIG. 7. First, write protect information is fetched from the protect register 210 (step S121). If the target write addresses are write-protected, the automatic write sequence ends. If the addresses are writable, it is determined whether or not the number of memory cells where "0" is written is equal to or greater than a predetermined number (step S122). According to the second embodiment, this determination is conducted for the data of the plurality of addresses. Namely, it is determined whether or not the number of "0" bits in the plurality of data pieces is equal to or greater than the predetermined number. For example, data pieces for eight addresses are collectively tested, and a single data invert flag is assigned for the data pieces of eight addresses. It is preferable that these addresses are consecutive. The details of this determination operation are the same as those of the first embodiment, and therefore, the explanation thereof is omitted. If it is determined that the number of memory cells to which a write bias is applied is equal to or greater than the predetermined number, the write data is inverted (step S123). Then, a write setup is carried out (step S124). According to the second embodiment, the first address is set in a counter. The write setup generates an internal voltage used to apply a write voltage to the target cells. More precisely, a step-up circuit (not shown) such as a charge pump is employed to generate a required voltage. To store the write data in the consecutive addresses, an address counter is arranged and is reset (step S124). Thereafter, data is written in a present address (step S125), and it is checked to see if the present address is the last address (step S126). If the present address is not the last address, the address is incremented (step S127), and the flow returns to step S124. In step S124, a write setup is conducted for the incremented address. In the second and the following cycles, the address incremented in step S127 is set as a present address, and the write operation is carried out for the present address. In this way, the write operation is carried out a predetermined number of times up to the last address. After writing the last address, a verify setup is carried out and the address is reset (step S128). Like the first embodiment, the verify setup controls a voltage applied to the cells from the bias voltage to a verify read voltage. Then, a verify read operation is conducted (step S129), write data is determined (step S130), and it is determined whether or not the present address is the last address (step S131). If the present address is not the last address, the present address is incremented (step S132), and the flow returns to step S129 to repeat the verify operation. In this way, the verify operation is continued up to the last address. Thereafter, for all addresses concerned, it is checked to see if the data written in the cells agree with the write data (step S133). If the verification is successful, the sequence ends. If the verification fails, the flow returns to step S124 to again carry out the write operation.

In this way, the second embodiment divides a write operation according to the number of simultaneously writable memory cells. For example, if an input/output bit width is 16 and if the simultaneously writable limit is 4 bits, the second embodiment divides the input/output width into four groups, selects the groups one after another over four times, and applies a write voltage to memory cells group by group. After applying a bias voltage for a predetermined write time to cells of a first address, the second embodiment increments the address, selects cells at the next address, and writes data therein. This is repeated up to the last address specified by a write command. After completing the writing of a given number of addresses, the second embodiment resets an internal address to the first address and controls the internal voltage to a verify level (verify setup). Then, the second embodiment carries out a verify read operation on each of the addresses where data has been written and determines write data (verify). If the verification is successful, each bit of the write data at the address is "1." The second embodiment repeats the verify read and data determination operations for all write addresses and checks to see if all of the write addresses have successfully been verified. If each bit of the write data at all addresses is "1," the verification is successful and the sequence ends. If there is a bit of "0" somewhere in the data, the write and verify operations are repeated.

As explained above, the nonvolatile memory according to the second embodiment can reduce the number of write operations conducted on the memory cell array, to thereby shorten a write time and reduce power consumption. Further, the second embodiment shares a data invert flag cell among a plurality of data pieces, to reduce an area allocated for the data invert flag cells in the memory cell array.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A nonvolatile memory comprising:
   a memory cell array including:
      a data storage area configured to store a data; and
      a data invert flag storage area configured to store a data invert flag indicating whether or not the data is inverted,
      the memory cell array configured to output selected data and a data invert flag related to the selected data;
   a state machine configured to determine whether or not the number of memory cells to which a bias voltage is applied is equal to or greater than a predetermined number when writing data into the memory cell array, the state machine configured to instruct a data controller to transfer inverted data and a data invert flag if it is equal to or greater than the predetermined number; and
   the data controller configured to receive the data to be written into the memory cell array, the data controller configured to transfer, to the memory cell array, the data inverted according to the instruction of the state machine and the data invert flag.

2. The nonvolatile memory of claim 1, wherein the data storage area is arranged on column bit lines and the data invert flag storage is arranged on column bit lines that are different from those for the data storage.

3. The nonvolatile memory of claim 1, wherein the data invert flag storage is arranged for each of addresses related to the data storage.

4. The nonvolatile memory of claim 1, wherein the data invert flag storage area is arranged for a plurality of addresses related to the data storage.

5. The nonvolatile memory of claim 1, wherein when determining whether or not the number of memory cells to which a bias voltage is applied is equal to or greater than the predetermined number, the state machine instructs, if the number is equal to or greater than a half of the number of bits of the data to write, the data controller to transfer, to the memory cell array, inverted data and a data invert flag indicating that the data is inverted.

6. The nonvolatile memory of claim 1, wherein when determining whether or not the number of memory cells to which a bias voltage is applied is equal to or greater than the predetermined number, the state machine refers to a write current supply capacity of an internal power controller provided for the nonvolatile memory, and according to the determination, instructs the data controller to transfer, to the memory cell array, inverted data and a data invert flag indicating that the data is inverted.

7. A nonvolatile memory comprising:
   a memory cell array having a plurality of arrayed memory cells including:
      data storage cells configured to store data; and
      a data invert flag storage cell configured to store a data invert flag indicating whether or not the data is inverted,
      the memory cell array configured to output selected data and a data invert flag related to the selected data;
   a row decoder configured to select a word line of the memory cell array related to the data;
   a column decoder configured to select bit lines of the memory cell array related to the data;

a data controller configured to receive the data to be stored in the memory cell array, the data controller configured to transfer the data, or inverted data and the data invert flag related to the data to the memory cell array, the data controller configured to provide a write bit line voltage through the column decoder to corresponding memory cells in the memory cell array when transferring;

a state machine configured to determine whether or not the number of memory cells to which a bias voltage is applied is equal to or greater than a predetermined number, when writing the data into the memory cell array, the state machine configured to instruct a data controller to transfer inverted data and the data invert flag if it is equal to or greater than the predetermined number; and a sense amplifier connected to bit lines of the memory cell array through the column decoder, the sense amplifier configured to invert, in a data read operation, selected data according to a data invert flag related to the selected data and output the inverted data.

8. The nonvolatile memory of claim 7, wherein the data storage is arranged on column bit lines and the data invert flag storage is arranged on column bit lines that are different from those for the data storage.

9. The nonvolatile memory of claim 7, wherein the data invert flag storage is arranged for each of addresses related to the data storage.

10. The nonvolatile memory of claim 7, wherein the data invert flag storage area is arranged for a plurality of addresses related to the data storage.

11. The nonvolatile memory of claim 7, wherein when determining whether or not the number of memory cells to which a bias voltage is applied is equal to or greater than the predetermined number, the state machine instructs, if the number is equal to or greater than a half of the number of bits of the data to write, the data controller to transfer, to the memory cell array, inverted data and a data invert flag indicating that the data is inverted.

12. The nonvolatile memory of claim 7, wherein when determining whether or not the number of memory cells to which a bias voltage is applied is equal to or greater than the predetermined number, the state machine refers to a write current supply capacity of an internal power controller provided for the nonvolatile memory, and according to the determination, instructs the data controller to transfer, to the memory cell array, inverted data and a data invert flag indicating that the data is inverted.

13. A nonvolatile memory comprising:
a memory cell array having a plurality of arrayed memory cells including:
data storage cells configured to store data; and
a data invert flag storage cell configured to store a data invert flag indicating whether or not the data is inverted, the data storage cells and the data invert flag storage cell corresponding to the data storage cells is in the same row, the memory cell array configured to output selected data and a data invert flag related to the selected data;
a row decoder configured to select a word line of the memory cell array related to the data;
a column decoder configured to select a bit line of the memory cell array related to the data;
an internal power controller configured to control a voltage applied to the memory cell array;
a protect register configured to store write-protect information concerning a given storage place in the memory cell array;

a command interface configured to receive a command related to an operation of the nonvolatile memory;

a state machine configured to receive, in response to an operation instruction from the command interface, write-protect information from the protect register, the state machine configured to determine a state of a data storage cell in the memory cell array related to a write target address, the state machine configured to obtain write data from a data controller if it is determined that the data storage place is writable, the state machine configured to determine whether or not the number of memory cells to which a bias voltage is applied is equal to or greater than a predetermined number when writing the data in the memory cell array, the state machine configured to instruct a data controller to transfer inverted data and a data invert flag if it is greater than the predetermined number;

the data controller configured to receive the data to be stored in the memory cell array, the data controller configured to transfer data inverted according to the instruction from the state machine and the data invert flag related to the inverted data to the memory cell array, the data controller configured to supply a write bit line voltage from the internal power controller through the column decoder to the target memory cells in the memory cell array; and a sense amplifier connected to bit lines of the memory cell array through the column decoder, the sense amplifier configured to invert, in a data read operation, selected data according to a data invert flag related to the selected data and output the inverted data.

14. The nonvolatile memory of claim 13, wherein the data storage is arranged on column bit lines and the data invert flag storage is arranged on column bit lines that are different from those for the data storage.

15. The nonvolatile memory of claim 13, wherein the data invert flag storage is arranged for each of addresses related to the data storage.

16. The nonvolatile memory of claim 13, wherein the data invert flag storage area is arranged for a plurality of addresses related to the data storage.

17. The nonvolatile memory of claim 16, wherein in response to an operation instruction from the command interface, the state machine receives write protect information from the protect register, determines states of a plurality of storage places at write target addresses, if it is determined that all of these storage places are writable, obtains a plurality of write data pieces from the data controller, determines, when writing the plurality of write data pieces in the memory cell array, whether or not the number of memory cells to which a bias voltage is applied is equal to or greater than a predetermined number, and if it is equal to or greater than the predetermined number, instructs the data controller to transfer, to the memory cell array, inverted ones of the plurality of write data pieces and a data invert flag indicating that the data pieces are inverted.

18. The nonvolatile memory of claim 13, wherein when determining whether or not the number of memory cells to which a bias voltage is applied is equal to or greater than the predetermined number, the state machine instructs, if the number is equal to or greater than a half of the number of bits of the data to write, the data controller to transfer, to the memory cell array, inverted data and a data invert flag indicating that the data is inverted.

19. The nonvolatile memory of claim 13, wherein when determining whether or not the number of memory cells to which a bias voltage is applied is equal to or greater than the predetermined number, the state machine refers to a write current supply capacity of an internal power controller provided for the nonvolatile memory, and according to the determination, instructs the data controller to transfer, to the memory cell array, inverted data and a data invert flag indicating that the data is inverted.

20. The nonvolatile memory of claim 13, wherein the nonvolatile memory is a NOR flash memory.

* * * * *